United States Patent [19]
Yonehara

[11] Patent Number: 5,394,675
[45] Date of Patent: Mar. 7, 1995

[54] TAB TAPE, METHOD OF BONDING TAB TAPE AND TAB TAPE PACKAGE

[75] Inventor: Katsuyuki Yonehara, Kyoto, Japan

[73] Assignee: International Business Machines Corp., Armonk, N.Y.

[21] Appl. No.: 42,218

[22] Filed: Apr. 2, 1993

Related U.S. Application Data

[62] Division of Ser. No. 793,897, Nov. 18, 1991, Pat. No. 5,243,141.

[30] Foreign Application Priority Data

Nov. 28, 1990 [JP] Japan .................................. 2-323424

[51] Int. Cl.⁶ .............................................. B65B 61/14
[52] U.S. Cl. ......................................... 53/410; 53/397; 29/827; 29/840
[58] Field of Search .................... 53/397, 410, 591; 29/827, 840

[56] References Cited

U.S. PATENT DOCUMENTS

| | | | |
|---|---|---|---|
| 4,330,790 | 5/1982 | Burns | 29/827 X |
| 4,466,183 | 8/1984 | Burns | 29/827 |
| 4,758,927 | 7/1988 | Berg | 29/827 X |
| 5,048,180 | 9/1991 | Tanaka | 29/840 |

FOREIGN PATENT DOCUMENTS

| | | | |
|---|---|---|---|
| 58-31566 | 8/1981 | Japan | 357/69 |
| 3-209735 | 9/1991 | Japan | 29/827 |

Primary Examiner—Linda B. Johnson
Assistant Examiner—Daniel Moon
Attorney, Agent, or Firm—Bernard Tiegerman

[57] ABSTRACT

A TAB (tape automated bonding) tape is disclosed which includes one or more openings, each adapted to receive a semiconductor chip, and electrical leads extending into each such opening. Significantly, this TAB tape also includes means for preventing a semiconductor chip, positioned within a tape opening, from being lifted toward a bonding tool as a result of electrical leads adhering to the bonding tool, when the bonding tool is used to bond contact pads on the semiconductor chip to the leads extending into the opening.

2 Claims, 5 Drawing Sheets

TAB TAPE, METHOD OF BONDING TAB TAPE AND TAB TAPE PACKAGE

This is a divisional of U.S. application Ser. No. 07/793,897, filed Nov. 18, 1991, now U.S. Pat. No. 5,243,141.

BACKGROUND OF THE INVENTION

1. Field of the Invention

This invention relates to a TAB (Tape Automated Bonding) tape technique, and more specifically to a TAB tape technique wherein a semiconductor chip is prevented from being lifted up by the adhesion between the bonding tool and the leads at the time of lead bonding. Furthermore, this invention relates to a TAB package structure which prevents contact between the leads and the chip.

2. Description of the Related Art

TAB tape is widely used in manufacturing semiconductor integrated circuit packages. FIG. 6 schematically shows a conventional TAB tape 10, and FIG. 7 shows a sectional view along line 7—7 of FIG. 6. TAB tape 10 is comprised of an electrically insulating tape 11 of a material such as polyimide and electrically conductive leads 14 formed on the insulating tape 11. The insulating tape 11 has an opening 12 at each chip attaching position and the leads 14 are formed around opening 12. Four elongated slots 16 are formed around each opening 12. Each lead 14 has an inner lead portion 18 projecting into opening 12 and an outer lead portion 20 extending across slot 16. The outer lead portions 20 terminate in test pads 22 which are used for circuitry testing. When a semiconductor chip is attached to a TAB tape, the semiconductor chip is positioned in an opening 12, and inner lead portions 18 are connected to the pads of the chip by the use of a bonding tool called Thermode. FIG. 8 shows the lead bonding operation. In this example, tape 10 is placed so that leads 14 face downward. As shown in FIG. 8 (A), tape 10 and chip 24 are positioned so that inner lead portions 18 and electrical contact pads 26 of the chip are aligned with each other, and all the inner lead portions 18 are simultaneously thermocompressively bonded to chip pads 26 by means of bonding tool 28. The top end of the bonding tool is formed of a hard material such as sintered diamond, whereas the leads are formed of, for example, copper plated with tin. This bonding method was satisfactory when the number of leads was small, but it was found that a lift-up problem of chips could occur as the number of leads increased. When the number of leads increases, the contact area between the bonding tool and leads increases and the adhesive force between the bonding tool and leads increases. For this reason, when the bonding tool is raised after the bonding, it may happen that chip 24 is lifted up at the same time, as shown in FIG. 8 (B), making the leads deform, whereby inner lead portions 18 are brought in contact with the edge of chip 24.

Although the surface of a chip is usually covered with a surface protecting layer such as polyimide, it is not always completely covered to its edge portion. In addition, there are chips of the type in which an exposed wiring pattern for evaluating the chip characteristics is provided in the edge portion.

Accordingly, it is not desirable for the leads to touch the chip.

The above problem can be solved by adding a work step to restore the deformed leads, but such work is inefficient and also may damage the leads or chip. Alternatively, a method can be conceived in which a chip is sucked by vacuum and fixed that way at the time of bonding. However, this method is complex and expensive because it requires a vacuum control mechanism, and it also requires extra control time. Although forming the bonding tool and leads with materials which do not adhere to each other can be considered as a further method, no practical technique has been proposed.

It is preferable to ensure the prevention of contact between the leads and the chip even after the bonding. This is not ensured by the above-mentioned vacuum suction method.

SUMMARY OF THE INVENTION

Accordingly, it is an object of this invention to provide a TAB tape technique for preventing a chip from being lifted up by adhesion of the bonding tool with the leads in the bonding of the TAB leads.

It is another object of this invention to provide a TAB package which can prevent contact between the leads and the chip.

This invention solves the above problem by devising a type of TAB tape. The TAB tape is formed so as to have chip pressure means extending into the openings in which chips are attached. The chip pressure means are preferably formed of the same material as the leads and provided on the same surface of the TAB tape as the leads and in the four corners of the openings in which the chips are attached. The chip pressure means serves to engage the surface of a chip bearing the chip contact pads, thereby preventing the chip from lifting or moving toward the leads.

In accordance with this invention, a bonding method and a TAB package using such a TAB tape are also disclosed.

BRIEF DESCRIPTION OF THE DRAWINGS

The invention is described with reference to the accompanying drawings, wherein.

DETAILED DESCRIPTION OF THE PREFERRED EMBODIMENTS

Figure 1:
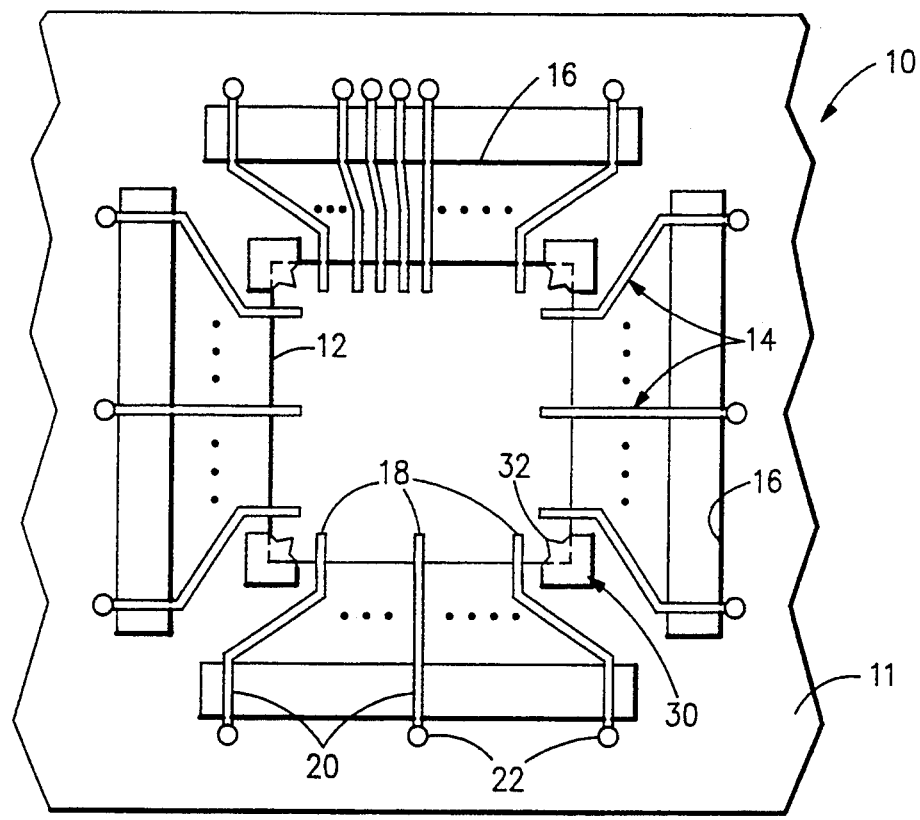
FIG. 1 is a schematic representation of a preferred embodiment of the TAB tape of this invention.
Figure 6:
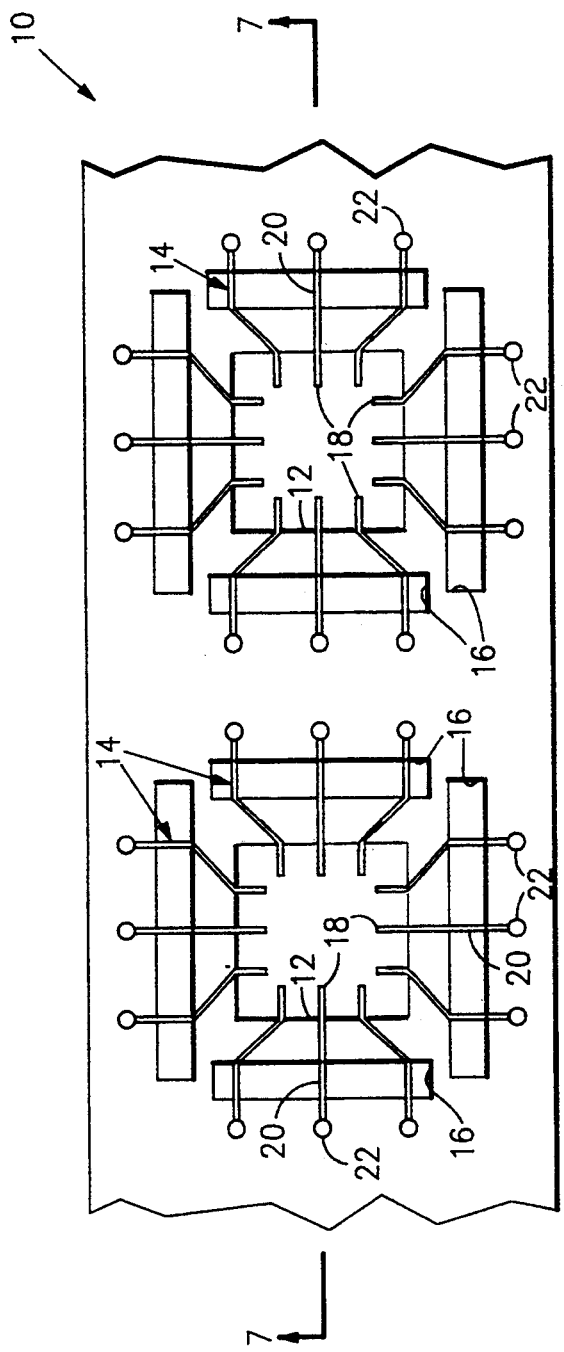
FIG. 6 is a schematic representation showing a conventional TAB tape.
Figure 7:
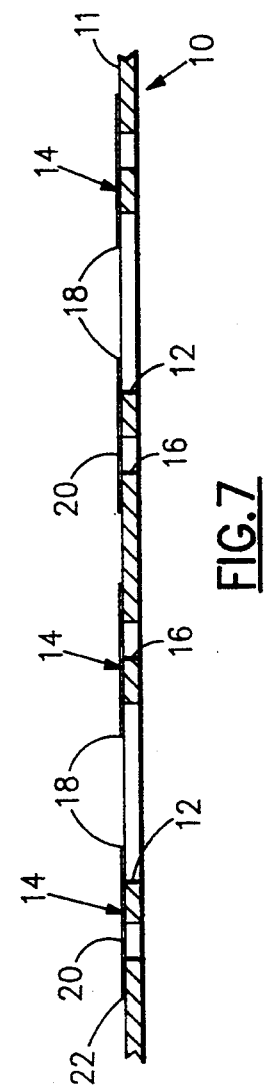
FIG. 7 is a sectional view along line 7—7 of FIG. 6.
Figure 8A:
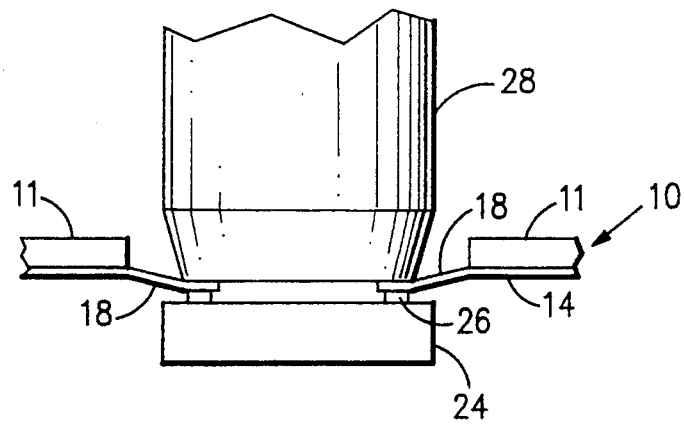
FIGS. 8A and 8B are a representation showing a conventional bonding operation.
Figure 8B:
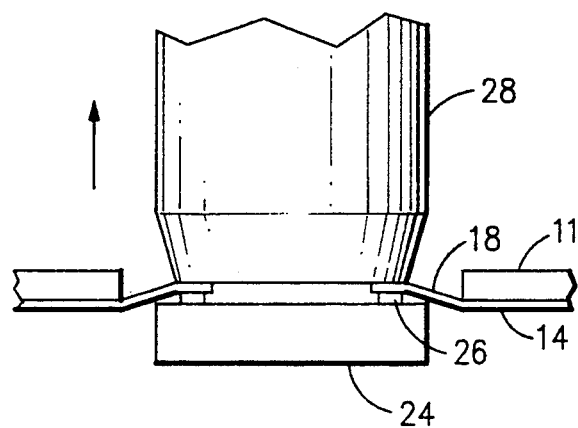

FIG. 1 shows a preferred embodiment of the TAB tape of this invention. The elements of the inventive TAB tape corresponding to those of the TAB tape in FIG. 6 are represented by the same reference numerals.

In the preferred embodiment of the inventive TAB tape 10, insulating tape 11 is a polyimide tape which is 125 microns thick, and leads 14 are made of 35 micron-thick copper having a tin surface coating. A total of 268 leads 14 are provided. Although only one opening 12 is shown in FIG. 1, a multiplicity of openings 12 are actually formed in the positions in which chips are attached. In addition, detailed structures such as sprocket holes are omitted from FIG. 1.

The distinguishing feature of the TAB tape of this invention lies in the fact that chip pressure members 30 are provided in the four corners of opening 12. The chip pressure members 30 each have a projecting portion 32 extending into opening 12. Leads 14 are usually formed by patterning the copper layer bonded to the polyimide tape. Consequently, by patterning the copper layer so as to simultaneously form leads 14 and chip pressure members 30, the chip pressure members 30 are readily formed on the same surface of the tape 11 and of the same material as leads 14.

Figure 2:
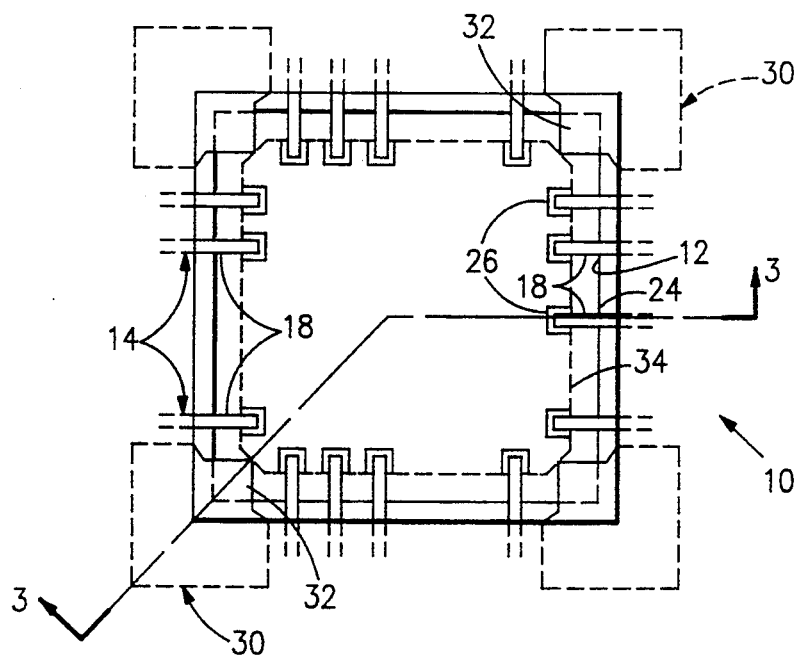
FIG. 2 is a schematic representation showing a semiconductor chip being placed in an opening of the inventive TAB tape depicted in FIG. 1 to which the chip is to be attached.

As shown in FIG. 2, tape 10 and chip 24 are aligned so that inner lead portions 18 and contact pads 26 of semiconductor chip 24 are aligned with each other at the time of bonding. In this example, the tape is placed so that the leads face downward. Projecting portions 32 of chip pressure members 30 overhang the four corners of chip 24 so as to be capable of engaging the surface of chip 24 bearing contact pads 26. Broken line 34 represents the shape of the bottom of the bonding tool.

Figure 3A:
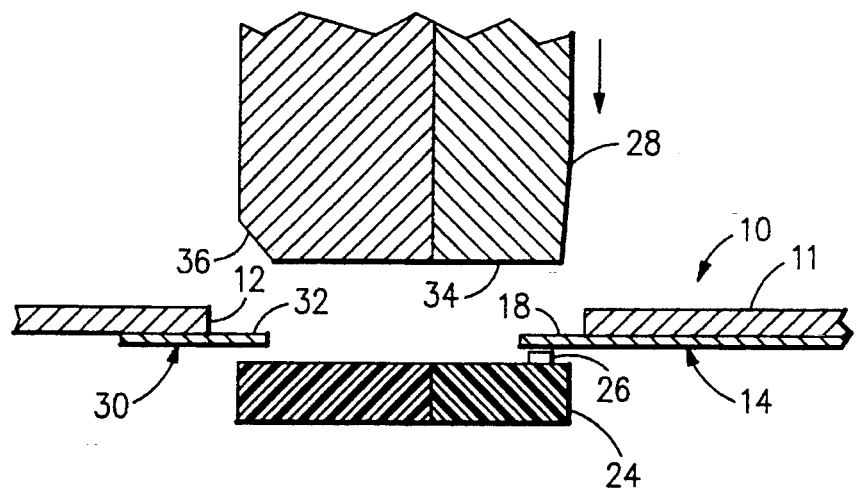
FIGS. 3A, 3B and 3C are a schematic representation showing the chip being bonded to the TAB tape of FIG. 2 when viewed along line 3—3 of FIG. 2.
Figure 3B:
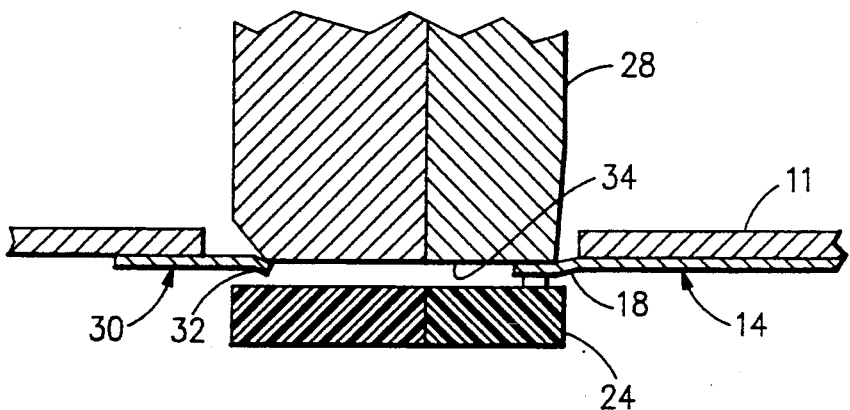
Figure 3C:
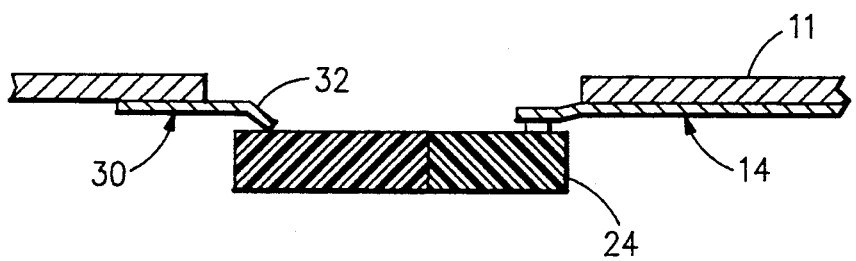

FIG. 3 shows the bonding operation using the TAB tape of this invention, and shows the situation as seen along line 3—3 of FIG. 2. For simplicity, only the section of the portion cut by the line 3—3 is shown. Bonding tool 28 has bottom surface 34 to be contacted with all inner lead portions 18, and inclined surfaces 36 are provided so as to engage with projecting portions 32 of chip pressure members 30. The inclined surfaces 36 are provided in the four corners of bottom surface 34 of the bonding tool 28 in correspondence to the chip pressure members 30.

As shown in (A) of FIG. 3, when bonding tool 28 descends, the four inclined surfaces 36 of the bonding tool engage projecting portions 32 of chip pressure members 30 and bend these projecting portions 32 in the downward direction. The bonding tool further downwardly moves while bending projecting portions 32 with the inclined surfaces 36, and thermocompressively bonds inner lead portions 18 to pads 26 by means of bottom surface 34 (FIG. 3, B). When the bonding tool 28 rises after the bonding, the lead portions 18 may adhere to bottom surface 34. In this invention, if the chip begins to lift up, the projecting portions 32 of the chip pressure members 30 engage the surface of the chip bearing the contact pads 26 to block further upward movement, and thus the lifting-up of the chip and hence the deformation of the leads is prevented. The projecting portions 32 which were bent act as spacers to maintain the spacing between the chip surface and the lead portions 18. In order to bend the projecting portions 32 simultaneously with the bonding of leads, a difference needs to occur between the height of the chip pressure members 30 and that of the bottom surface 34 at its lowest position. If gold is used as the material for chip contact pads 26, the thickness of the gold pads is ordinarily reduced by a factor of several numbers. Thus, the design needs to be made such that the necessary difference in height is obtained, considering the thickness change. Even if the tip of the projecting portions 32 touches the chip surface, no problem occurs because the chip surface, except for the pads, is covered with a surface protecting insulating layer, a polyimide layer in this example, and the tip of the projecting portions 32 touches the polyimide layer.

Figure 4:
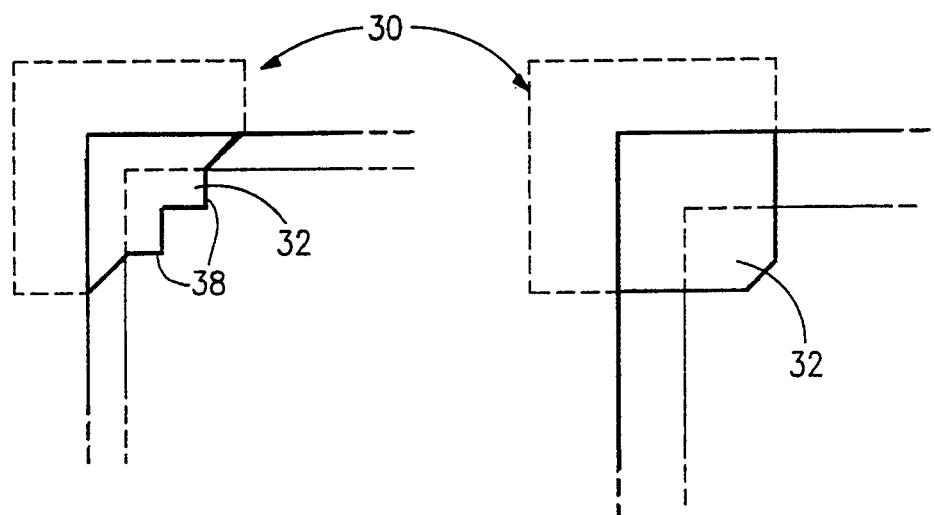
FIG. 4 is a representation showing another example of chip pressure members.

As shown in FIG. 4, chip pressure members 30 can be formed so as to have either two protrusions 38 in projecting portion 32 or a substantially rectangular projecting portion 32. It should be apparent that the shape of the chip pressure members 30 is not limited to these forms, but it can be formed in any suitable shape.

Figure 5:
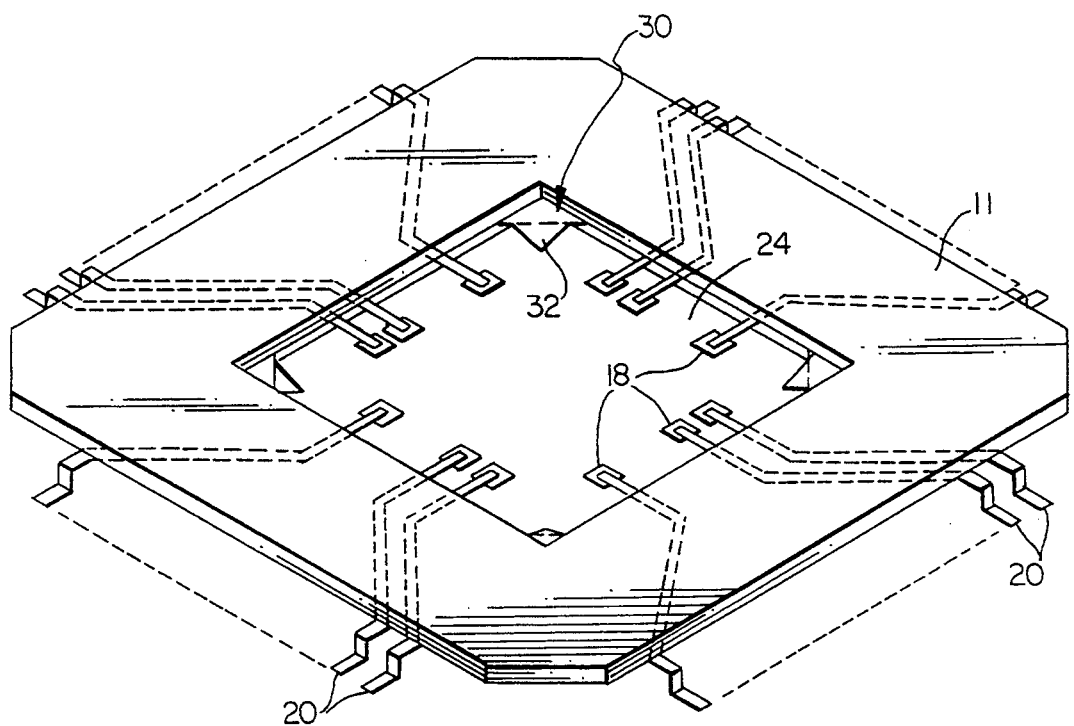
FIG. 5 is a schematic representation of a TAB package formed in accordance with the present invention.

FIG. 5 is a schematic illustration of the TAB package which was formed using the TAB tape of this invention. After the bonding, the chip is tested using test pads 22 (FIG. 1). By resin-sealing the surface of the chip bearing the contact pads and then cutting along the outer edge of slots 16 as needed, a chip assembly is separated from the tape. Outer lead portions 20 are molded into a shape suitable for being attached to a circuit board (not shown), whereby a TAB package is formed.

In addition to the above embodiments, various modifications are available. For instance, the chip pressure members may be formed on the surface of the insulating tape which is opposite to the tape surface bearing the leads. In this case, the chip pressure members in the four corners need not always be separated. Furthermore, the chip pressure members need not always be provided in the four corners of a chip if the lead density is relatively small and if spaces for engagement of the chip pressure members can be secured in positions other than the four corners. Moreover, if the spacing between the chip surface and the leads can be maintained after bonding, the chip pressure members need not be of the same material as that of the leads. In addition, although the TAB tape was bonded with the leads being faced downward, it may be bonded with the leads being faced upward.

In accordance with this invention, a chip is easily and securely prevented from being lifted up by the adhesion between the bonding tool and the leads at the time of bonding. In addition, in accordance with this invention, a TAB package structure is readily obtained wherein the spacing between the leads and the chip surface can be maintained and thus the contact of the leads with the chip can be prevented even after the bonding.

I claim:

1. A method for mounting a semiconductor chip onto a TAB tape, comprising the steps of:
   providing a TAB tape which comprises an electrically insulating tape including at least one opening intended to receive a semiconductor chip, electrically conductive leads on the insulating tape which extend into said opening and means on said insulating tape, including at least one projecting portion, extending into said opening, for engaging a surface of said chip bearing contact pads;
   positioning said semiconductor chip adjacent said opening so that said leads are positioned adjacent said contact pads and said projecting portion is positioned adjacent said surface bearing said contact pads;
   moving a bonding tool toward said opening, said bonding tool including a bottom surface used for bonding said leads to said contact pads and at least one inclined surface for engaging said projecting portion; and
   bending said projecting portion toward said surface of said semiconductor chip bearing said contact pads by engaging said projecting portion with said inclined surface during said moving.

2. The method of claim 1, further comprising the step of moving said bonding tool away from said opening and engaging said surface of said semiconductor chip bearing said contact pads with said projecting portion.

* * * * *